United States Patent [19]

Keana

[11] 4,099,918

[45] Jul. 11, 1978

[54] PROXYL NITROXIDES AS SPIN LABELS

[75] Inventor: John F. W. Keana, Eugene, Oreg.

[73] Assignee: State Board of Higher Education For and on Behalf of the University of Oregon

[21] Appl. No.: 788,621

[22] Filed: Apr. 18, 1977

[51] Int. Cl.$^2$ .................... G01N 27/78; C07D 207/46
[52] U.S. Cl. ................................ 23/230 R; 23/230 B; 260/326.8; 424/0.5
[58] Field of Search .................... 23/230 R, 230 B

[56] References Cited

U.S. PATENT DOCUMENTS

| | | | |
|---|---|---|---|
| 3,489,522 | 1/1970 | McConnell | 23/230 B |
| 3,668,214 | 6/1972 | McConnell | 23/230 BX |
| 3,690,834 | 9/1972 | Goldstein | 23/230 BX |
| 3,697,535 | 10/1972 | Leute | 23/230 BX |
| 3,732,244 | 5/1973 | Boocock | 23/230 BX |
| 3,740,412 | 6/1973 | Ullman | 23/230 BX |
| 3,850,578 | 11/1974 | McConnell | 23/230 B |
| 3,873,564 | 3/1975 | Schneider | 23/230 BX |
| 3,887,698 | 6/1975 | McConnell | 23/230 BX |
| 3,966,409 | 6/1976 | Hrvoic | 23/230 R |

*Primary Examiner*—Sidney Marantz
*Attorney, Agent, or Firm*—Kolisch, Hartwell, Dickinson & Stuart

[57] ABSTRACT

Spectrometric analysis of biological molecules with tetraalkylpyrrolidine-N-oxyl nitroxides.

2 Claims, No Drawings

PROXYL NITROXIDES AS SPIN LABELS

The invention described herein was made in the course of work under a grant or award from the Department of Health, Education and Welfare.

This invention relates to novel pyrrolidine-N-oxyl nitroxides, hereinafter also referred to for brevity's sake as proxyl nitroxides, useful in the spin labeling of biological molecules.

Dimethyldialkyloxazolidine-N-oxyl nitroxides, hereinafter for brevity's sake also referred to as doxyl nitroxides, have enjoyed wide application in the study of biological membranes by spin labeling techniques. For a discussion of such doxyl nitroxides, reference is made to J. F. W. Keana and T. D. Lee, J. Am. Chem. Soc., 97, 1273 (1975), and to such patents as U.S. Pat. No. 3,673,207 and U. S. Pat. No. 3,668,214. Spin labeling techniques are discussed in P. Jost and O. H. Griffith, Methods Parmacol., 2, 223 (1972).

While doxyl nitroxides have been widely used in spin labeling, the use of such nitroxides has been accompanied by several shortcomings. Further explaining, a doxyl nitroxide may be represented schematically by the following formula:

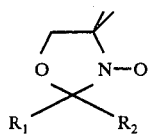

(1)

It will be noted that doxyl nitroxide (1) includes an oxygen atom in the oxazolidine ring, and the presence of this ring oxygen atom open up pathways for decomposition. This limits the nature of subsequent chemical reactions performable on remote portions of a molecule containing such a ring. Reference is made to S. Chou, J. A. Nelson, and T. A. Spencer, J. Org. Chem., 39, 2356 (1974); J. A. Cella, J. A. Kelley, and E. F. Kenehan, J. Org. Chem., 40, 1860 (1975), and further to B. J. Gaffney, in "Spin Labeling: Theory and Applications", L. J. Berliner, Ed., Academic Press, New York, N.Y., 1975, Chapter 5. The presence of the ring oxygen atom further gives rise to irreversible loss of ESR signal in some spin labeling studies, probably because of reduction of the compound to the hydrolytically unstable N-hydroxy derivative. Furthermore, the oxygen atom within the ring renders the ring quite polar and this polarity is a detriment in the probing, for example, of hydrophobic regions of a membrane.

The proxyl nitroxides of this invention may be represented by the following formula:

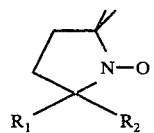

(2)

wherein $R_1$ and $R_2$ are alkyl, aliphatic, or aromatic groups, saturated or unsaturated, and the carbon atoms of $R_1$ and $R_2$, together with the carbon atom in the pyrrolidine-N-oxyl ring to which the $R_1$ and $R_2$ groups are attached, form a carbon-to-carbon open chain of from four to fifty, but normally eight to thirty, carbon atoms.

The use of such proxyl nitroxides as spin labels for biological molecules offers a number of advantages. The pyrrolidine-N-oxyl or proxyl ring is devoid of an oxygen atom. As a consequence, the decomposition difficulties encountered with doxyl nitroxides by reason of the latter's ring oxygen are not experienced. Furthermore, the proxyl group or ring is significantly less polar than the doxyl group or ring.

In preparing the proxyl nitroxides of the invention, advantage may be taken of the ready reaction of the pyrroline nitrone represented by the following formula:

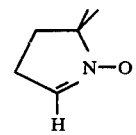

(3)

with an organometallic reagent such as a Grignard reagent $R_1.M.X$ (wherein M is a metal [usually magnesium] and X is a halogen) or an organolithium reagent to produce N-hydroxy intermediate illustrated by the following formula:

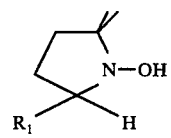

(4)

Since an alpha hydrogen atom is present in intermediate (4), oxidation of the intermediate leads to a new nitrone represented by the following formula:

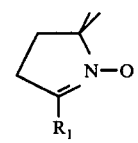

(5)

This new nitrone (5) itself is capable of undergoing condensation with a different Grignard reagent $R_2.M.X$ or organolithium reagent to produce N-hydroxy intermediate (6)

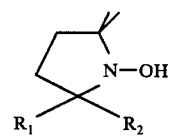

(6)

Oxidation of intermediate (6) produces proxyl nitroxide (2).

For a discussion of Grignard condensation of pyrroline nitrone, reference is made to E. Lunt, Nitro Compd., Proc. Int. Symp., 291 (1963); Chem. Abstr., 64, 676 (1966), and to the Keana and Lee article in the Journal of the American Chemical Society above referred to. It is also recognized that pyrroline nitrones have been used as free radical trapping agents, as discussed in E. G. Janzen and C. A. Evans, J. Am Chem.

Soc., 95, 8205 (1973), and M. Iwamura and N. Inamoto, Bull, Chem. Soc. Jpn., 40, 703 (1967).

The following examples illustrate the preparation of various proxyl nitroxides as contemplated by this invention.

EXAMPLE I

A proxylstearyl alcohol (7) was prepared.

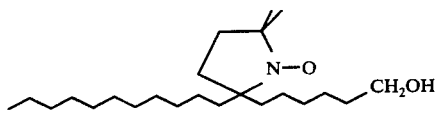
(7)

In the preparation, nitrone (3) was employed, and for a discussion of this nitrone, reference is made to R. Bonnett, R. F. C. Brown, V. M. Clark, I. O. Sutherland, and A. Todd, J. Chem. Soc., 2094 (1959). To a stirred solution of 3.52 g of this nitrone, in 10 ml of tetrahydrofuran, there was added dropwise, at reflux ($N_2$), 45.6 ml (1.5 equiv) of a 1.0 M solution of undecylmagnesium chloride in tetrahydrofuran. After 1 h at reflux, the reaction was quenched with saturated $NH_4Cl$. The usual workup afforded crude N-hydroxy intermediate (4).

The hydroxy intermediate was immediately taken up with 170 ml of a mixture of MeOH and concentrated $NH_4OH$ (15:2), and stirred under air in the presence of 12.9 g of $Cu(OAc)_2.H_2O$ for 1 h, affording 7.07 g of nitrone (5) (bp 118—121° (0.005 mm); m/e or mass to charge ratio in the mass spectrum 267.257). $R_1$ in this nitrone was the radical $CH_3(CH_2)_{10}$-.

500 mg of this nitrone in 10 ml of tetrahydrofuran was reacted at 25° ($N_2$) with 2.8 ml (1.5 equiv) of a 1.0 M tetrahydrofuran solution of $THPO(CH_2)_6MgCl$ (THPO refers to tetrahydropyranyloxy). This reaction after 18 h was quenched by dropwise addition (0°) of 10 ml of MeOH and 5 ml of 3 N HCl. The quenched mixture was stirred for 1.5 h at 0° to hydrolyze the tetrahydropyranyl ether grouping.

The usual workup provided the crude N-hydroxy alcohol, which was dissolved in MeOH (10 ml) containing 5 mg of $Cu(OAc)_2.H_2O$ and stirred under air for 1 h. Preparative thin layer chromatography over silica gel produced 154 mg (22%) of 7-proxylstearyl alcohol (7) (m/e 368.354), or proxyl nitroxide (2) wherein $R_1$ is a $CH_3(C_2)_{10}$- radical and $R_2$ is a —$(CH_2)_5CH_2OH$ radical.

EXAMPLE II

In another preparation nitrone (3) was allowed to react with a Grignard reagent derived from 1-bromopentadec-6-yne (m/e 286.131). Such compound may be prepared by reaction of 1-lithiodecyne with 1,5-dibromopentane. After oxidation nitrone (5) was produced (m/e 319.285), wherein $R_1$ is the radical $CH_3(CH_2)_7C\equiv C(CH_2)_5$-. Addition of lithium acetonitrile in tetrahydrofuran to this substance ($-78° \rightarrow 25°$) followed by oxidation afforded a mixture (47%) of nitroxide (2) wherein $R_1$ is the above-identified radical and $R_2$ is a -$CH_2C\equiv N$ radical, and the corresponding lactone (by ir).

Base hydrolysis of this mixture followed by preparative thin layer chromatography over silica gel produced 9,10-dehydro-3-proxyloleic acid, or proxyl nitroxide (2) wherein $R_2$ is a —$CH_2CO_2H$ radical.

This proxyl nitroxide in turn may be esterified with diazomethane to produce proxyl nitroxide (2) wherein $R_2$ is a —$CH_2CO_2Me$ radical.

The proxyl rings in the proxyl nitroxides of this invention are relatively chemically stable, as evidenced by the following example.

EXAMPLE III

The 7-proxylstearyl alcohol of Example I was converted to an aldehyde by oxidation of the alcohol with N-chlorosuccinimide-dimethyl sulfide, using the method of E. J. Corey and C. U. Kim, J. Am. Chem. Soc., 94, 7586 (1972). In the resulting proxyl nitroxide (2), $R_2$ is a —$(CH_2)_5CHO$ radical.

An ether solution of the aldehyde prepared as above was subjected to two phase oxidation with Tollen's reagent to produce 7-proxylstearic acid (m/e 382.330) wherein $R_2$ of the proxyl nitroxide (2) is -$(CH_2)_5CO_2H$. Use of such Tollen's reagent is reported in R. Roberts, J. Gilbert, L. Rodewald and A. Wingrove in "An Introduction to Modern Experimental Organic Chemistry", Holt, Rinehart, and Winston, 1974, pp. 439–440.

7-proxylstearyl alcohol prepared as in Example I may be converted to a mesylate by reacting the same with methanesulfonyl chloride-$Et_3N$ in ether at 0°, following the method of Crossland and Servis, J. Organic Chem., 35, 3195 (1970). The mesylate when taken up in tetrahydrofuran saturated with trimethylamine and heated to 110° for 1 h (bomb) produced a crystalline quaternary amine salt which was a yellow solid, mp 88.5°–89.5°. In this proxyl nitroxide (2), $R_2$ is a —$(CH_2)_5CH_2N+(Me)_3OS-O_2CH_3$ radical.

The following examples illustrate the use of proxyl nitroxides in the spin labeling of various compositions.

EXAMPLE IV

A mixture was prepared from egg lecithin, cholesterol, and 7-proxylstearyl alcohol (molar ratio 150:75:1). This was dispersed in water. A conventional ESR spectrometer was used to observe the ESR spectral lines. Qualitatively, the ESR spectrum of the alcohol in the system ($A_{max}=32G$, where A is the nitrogen hyperfine splitting constant and G is gauss), was the same as where the alcohol was replaced by 7-doxylstearyl alcohol (m/e 370.332), prepared from 7-oxooctadecanol by the method disclosed in J. F. W. Keana, S. B. Keana, and D. Beetham, J. Am. Chem. Soc., 89, 3055 (1967).

EXAMPLE V

A sonicated mixture of 7-doxylstearyl alcohol, cardiolipin and cytochrome c (molar ratio 1:70:20) in water was prepared. No ESR signal could be observed in the mixture, indicating irreversible reduction of the doxyl nitroxide. A comparable mixture was prepared substituting 7-proxylstearyl alcohol for the doxyl nitroxide. With this mixture, an ESR signal was readily observed. The signal intensity increased threefold when oxygen was briefly bubbled through the sample, demonstrating that while the proxyl nitroxide suffered some reduction in the cytochrome c preparation, the reaction was reversible to a large extent.

Experiments have demonstrated that when a doxyl nitroxide and a proxyl nitroxide are partitioned under identical conditions between dodecane and water, the proxyl nitroxide is significantly less polar than the doxyl nitroxide. Furthermore, the ESR spectrum of the proxyl nitroxide is more sensitive to changes in polarity of the medium than that of the doxyl nitroxide, important in determining whether or not a probe is in a water-like or hydrocarbon-like environment.

It is claimed and desired to secure by letters patent:

1. In the spectrometric analysis of biological molecules, the method comprising labeling the molecule with a 2,2,5,5-tetraalkylpyrrolidine-N-oxyl nitroxide having the formula:

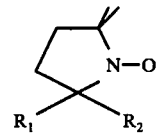

wherein $R_1$ and $R_2$ are alkyl, aliphatic, or aromatic groups, saturated or unsaturated, and the carbon atoms in $R_1$ and $R_2$, together with the carbon atom in the pyrrolidine-N-oxyl ring to which $R_1$ and $R_2$ are attached, form a carbon-to-carbon open chain of from four to fifty carbon atoms, and observing the ESR signal of the labeled molecule.

2. The method of claim 1, wherein the nitroxide is a proxyl stearyl compound.

* * * * *